United States Patent
Thong et al.

(10) Patent No.: US 9,601,405 B2
(45) Date of Patent: Mar. 21, 2017

(54) SEMICONDUCTOR PACKAGE WITH AN ENHANCED THERMAL PAD

(71) Applicant: Avago Technologies General IP (Singapore) Pte. Ltd., Singapore (SG)

(72) Inventors: Wing Hung Thong, Penang (MY); Liu Mei Lee, Penang (MY); Chee Wei Ong Khaw, Penang (MY); Ewe Lee Lim, Penang (MY)

(73) Assignee: Avago Technologies General IP (Singapore) Pte. Ltd., Singapore (SG)

( * ) Notice: Subject to any disclaimer, the term of this patent is extended or adjusted under 35 U.S.C. 154(b) by 0 days.

(21) Appl. No.: 14/806,428

(22) Filed: Jul. 22, 2015

(65) Prior Publication Data

US 2017/0025325 A1   Jan. 26, 2017

(51) Int. Cl.
*H01L 23/52* (2006.01)
*H01L 23/367* (2006.01)

(52) U.S. Cl.
CPC ................................ *H01L 23/3675* (2013.01)

(58) Field of Classification Search
CPC ..... H01L 23/52; H01L 33/62; H01L 23/3675; H01L 23/49503; H01L 23/49513; H01L 23/5384; H01L 23/5226
See application file for complete search history.

(56) References Cited

U.S. PATENT DOCUMENTS

| | | | |
|---|---|---|---|
| 6,075,995 A | 6/2000 | Jensen | |
| 8,314,472 B2 | 11/2012 | Parkhurst et al. | |
| 8,344,504 B2 | 1/2013 | Wholey et al. | |
| 8,536,707 B2 | 9/2013 | Wholey et al. | |
| 8,946,904 B2 | 2/2015 | Railkar et al. | |
| 2004/0261980 A1* | 12/2004 | Dani | H01L 23/10 165/104.33 |
| 2009/0213553 A1* | 8/2009 | Tschirbs | H01L 23/053 361/709 |
| 2011/0186992 A1 | 8/2011 | Wu et al. | |
| 2012/0049345 A1 | 3/2012 | Railkar et al. | |

(Continued)

FOREIGN PATENT DOCUMENTS

| | | |
|---|---|---|
| EP | 0484180 A1 | 5/1992 |
| GB | 2325082 | 11/1998 |
| KR | 1020130072412 A | 7/2013 |

OTHER PUBLICATIONS

"More effective cooling. With PLANSEE's heat spreaders.", available at http://www.plansee.com/en/Products-Heat-sinks-Heat-spreaders-495.htm, Heat spreader made of molybdenum-copper (MoCu), tungsten-copper (WCu) and Cu—MoCu—Cu laminates, Jan. 29, 2015, 2 pages.

(Continued)

*Primary Examiner* — Phuc Dang

(57) ABSTRACT

A semiconductor package having a substrate, a thermal pad, and a semiconductor die is disclosed. The thermal pad may have a heat conductive body extending through the substrate. The semiconductor die may be disposed on the thermal pad and in thermal communication with the thermal pad. The thermal pad of the semiconductor package may also have an interlock structure. The interlock structure may provide a mechanical interlock between the thermal pad and the substrate. In addition, a wireless communication device is also disclosed.

59 Claims, 12 Drawing Sheets

(56) References Cited

U.S. PATENT DOCUMENTS

| | | | |
|---|---|---|---|
| 2012/0132885 A1* | 5/2012 | Lippert | B82Y 10/00 257/9 |
| 2013/0143336 A1* | 6/2013 | Jain | H01L 33/0079 438/22 |
| 2014/0209168 A1* | 7/2014 | Zhamu | H01L 31/052 136/259 |
| 2014/0272310 A1* | 9/2014 | Lazur | B05D 3/002 428/164 |
| 2014/0376326 A1 | 12/2014 | Lee et al. | |
| 2016/0141232 A1* | 5/2016 | Cannon | H01L 23/552 257/659 |

OTHER PUBLICATIONS

Co-pending U.S. Appl. No. 14/799,534, filed Jul. 14, 2015.

* cited by examiner

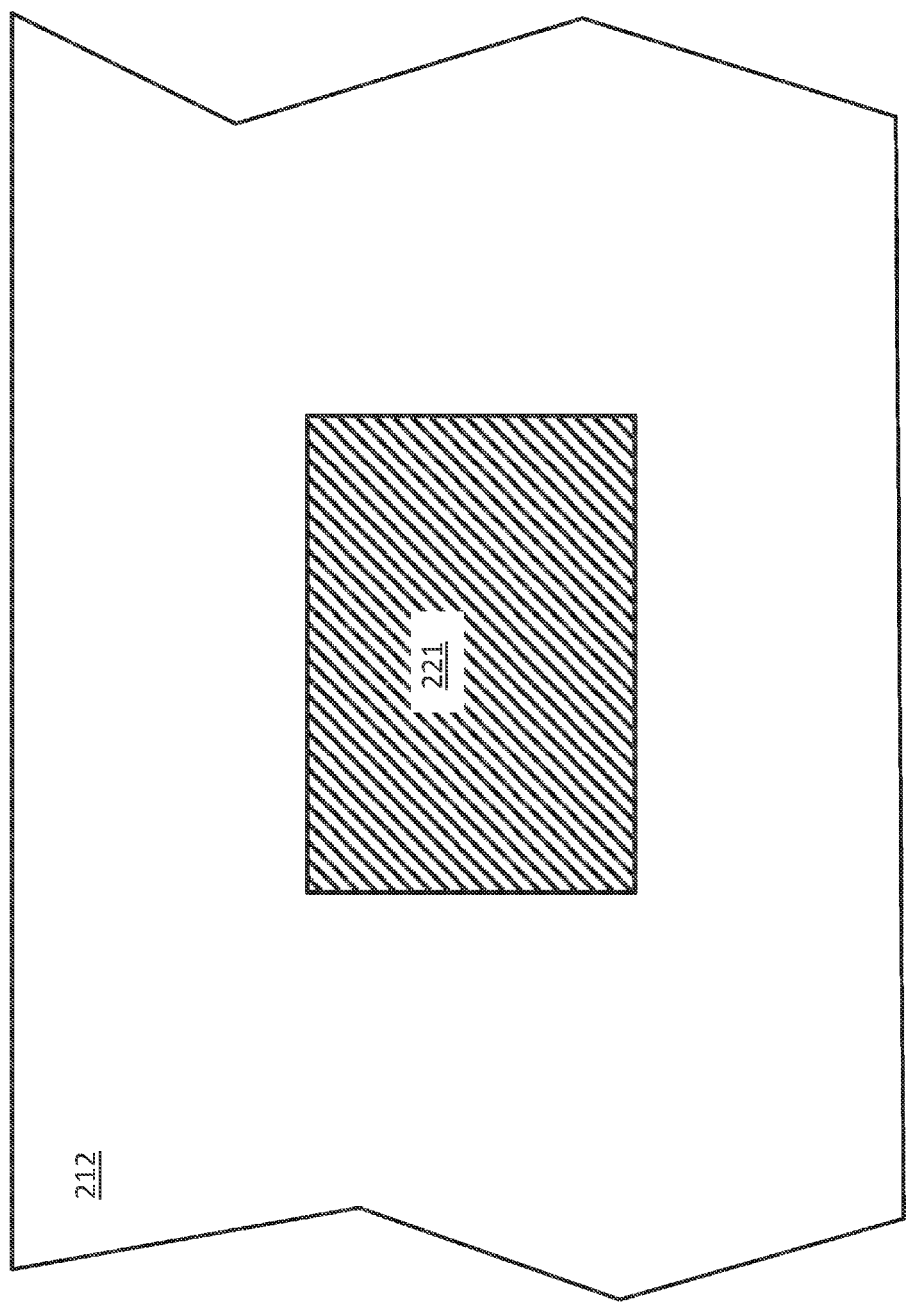

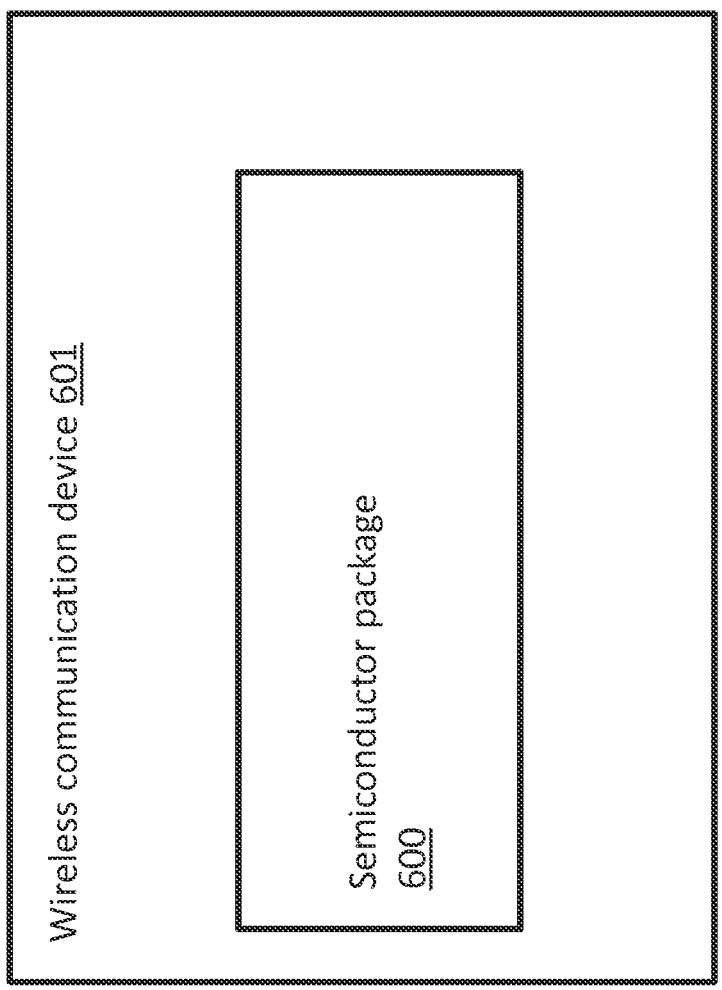

SEMICONDUCTOR PACKAGE WITH AN ENHANCED THERMAL PAD

BACKGROUND

Commercialization and recent advancements of communication systems has intensified packaging technology development towards miniaturization. Miniaturization requires more components to be placed within close proximity of one another to produce a smaller form factor. Each component is also required to deliver more functionalities than before. Nowadays, a mobile communication device is required to be able to perform multiple functionalities such as Internet browsing, location tracking, and movement sensing.

These miniaturization and functionalities requirements may necessitate the semiconductor package to consume more power, which ultimately generates more heat. When the heat in the semiconductor package is not adequately dissipated, it may cause premature failure and other reliability issues. Unmanaged heat may also shorten the lifetime and affect the overall performance of the semiconductor package.

Fabricating a thermal dissipation solution, which can dissipate heat efficiently, into a small and integrated semiconductor package, may introduce some challenges. For example, attachment of the thermal dissipation solution to a substrate of the semiconductor package may pose some undesirable reliability issues.

BRIEF DESCRIPTION OF THE DRAWINGS

Illustrative embodiments by way of examples, not by way of limitation, are illustrated in the drawings. Throughout the description and drawings, similar reference numbers may be, but not necessarily, used to identify similar elements. The drawings are for illustrative purpose to assist understanding and may not be drawn per actual scale. Some of the drawings may be simplified to show key features, appearances, and/or working principles in order to assist understanding.

FIG. 2D illustrates a diagrammatic top view of the semiconductor package in FIG. 2A without the semiconductor die and the wire bond pad;

FIG. 6A illustrates a block diagram of a wireless communication device;

DETAILED DESCRIPTION

Figure 1:
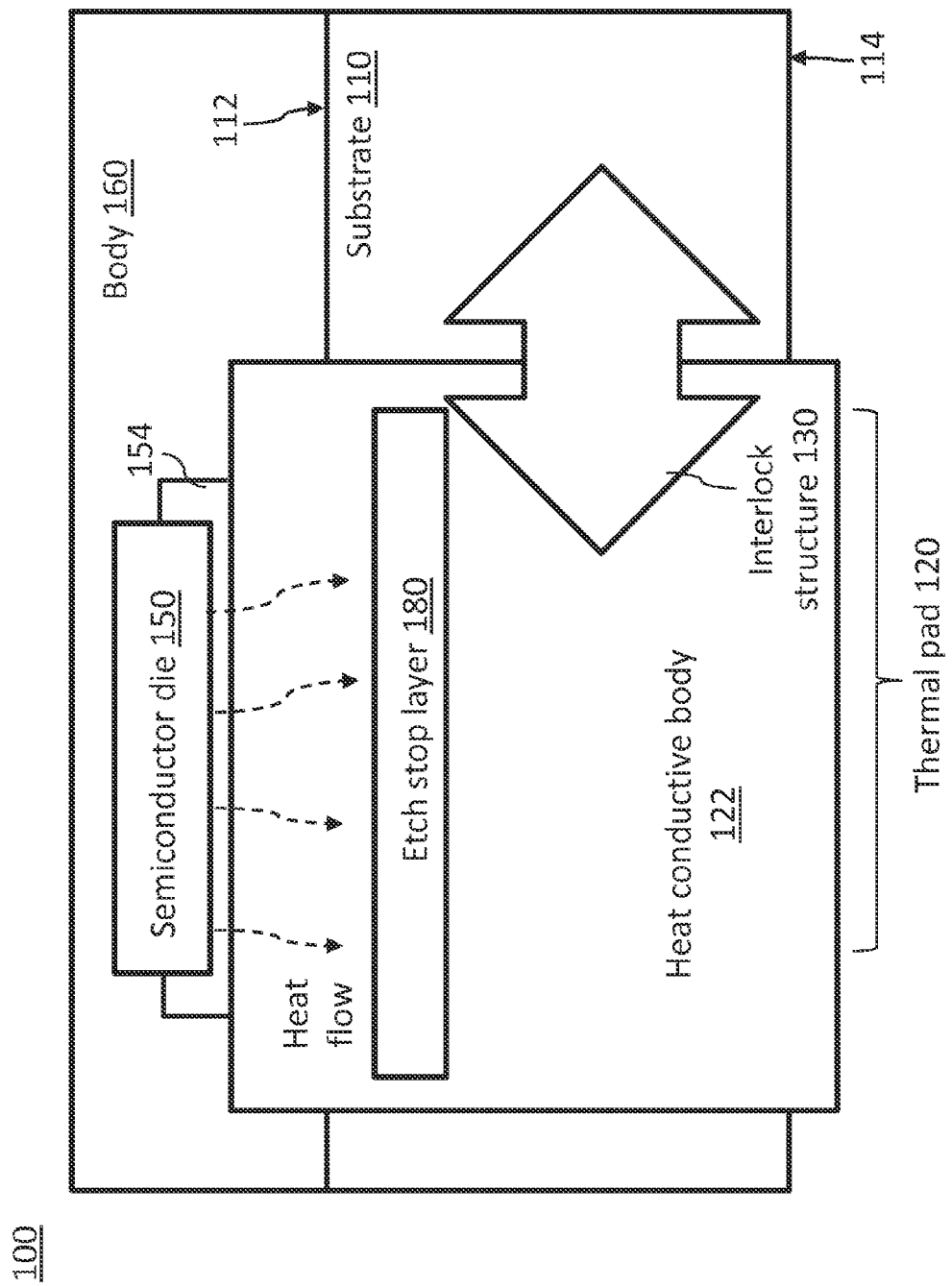
FIG. 1 illustrates a block diagram of a semiconductor package.

FIG. 1 illustrates a block diagram of a semiconductor package 100. The semiconductor package 100 may comprise a substrate 110, a semiconductor die 150, a thermal pad 120, and a body 160. The substrate 110 may be a printed circuit board, which is also referred as "PCB". The body 160 may refer to a structure that encapsulates the semiconductor die 150 and covers a portion of the substrate 110. In another embodiment, the body 160 may be a mold compound.

The thermal pad 120 may be a pad where the semiconductor die 150 is mounted on and is used to dissipate heat away from the semiconductor die 150. The thermal pad 120 may be made from copper or aluminum or other thermally conductive materials. The thermal pad 120 may comprise a heat conductive body 122 and an interlock structure 130.

The heat conductive body 122 of the thermal pad 120 may be extending through the substrate 110. The semiconductor die 150 may be disposed on one side 112 of the substrate 110. The heat conductive body 122 may be extending completely through the substrate 110 so as to dissipate the heat generated on one side 112 of the substrate 110 to an opposite side 114 of the substrate 110. An opposite side 114 of the substrate 110 may be thermally coupled to an external heat dissipating material (not shown).

The interlock structure 130 may be integrally formed with the heat conductive body 122 of the thermal pad 120. The interlock structure 130 may be serving as interface between the thermal pad 120 and the substrate 110 so as to provide a mechanical interlock between the thermal pad 120 and the substrate 110. By operating as the interface between the thermal pad 120 and the substrate 110, the interlock structure 130 is in direct contact and/or directly engages the substrate 110 so as to establish the interlock mechanism with the substrate 110.

The interlock structure 130 may be substantially smaller in size compared to the heat conductive body 122 of the thermal pad 120. For example, the interlock structure 130 may be at least 5 times smaller in size than the heat conductive body 122 of the thermal pad 120. In one embodiment, the interlock structure 130 may be at least 10 times smaller in size than the heat conductive body 122 of the thermal pad 120. In another embodiment, the interlock structure 130 may be at least 20 times smaller in size than the heat conductive body 122 of the thermal pad 120. The interlock structure 130 may be substantially smaller in size than the heat conductive body 122 such that the thermal pad 120 may establish mechanical interlock with the substrate 110 without sacrificing heat dissipation capability of the thermal pad 120 in conducting heat away from the semiconductor die 150. Further elaboration on this feature can be found in the discussion on FIG. 2C below.

The thermal pad 120 may comprise an etch-able material. In a manufacturing process of the thermal pad 120, the etch-able material may be unnecessarily etched away during the etching process. The thermal pad 120 may comprise an etch stop layer 180 so as to prevent the etch-able material from being etched away. The etch stop layer 180 may comprise a non-etch-able material such as Nickel. The etch stop layer 180 may be formed within the thermal pad 120. The etch stop layer 180 and the manufacturing process of the thermal pad 120 will be elaborated further in FIG. 6.

The semiconductor die 150 may be disposed on the thermal pad 120. The semiconductor die 150 may be a Gallium Arsenide (GaAs) die or other type of semiconductor die that may be used in a mobile communication device. The semiconductor die 150 may be in thermal communication with the thermal pad 120 thereby enabling the thermal pad 120 to dissipate heat away from the semiconductor die 150. The semiconductor die 150 may be coupled to the thermal pad 120 with a thermally conductive attachment member 154 so as to enable heat from the semiconductor die 150 to be dissipated away from the semiconductor die 150 through the thermal pad 120.

Figure 2A:
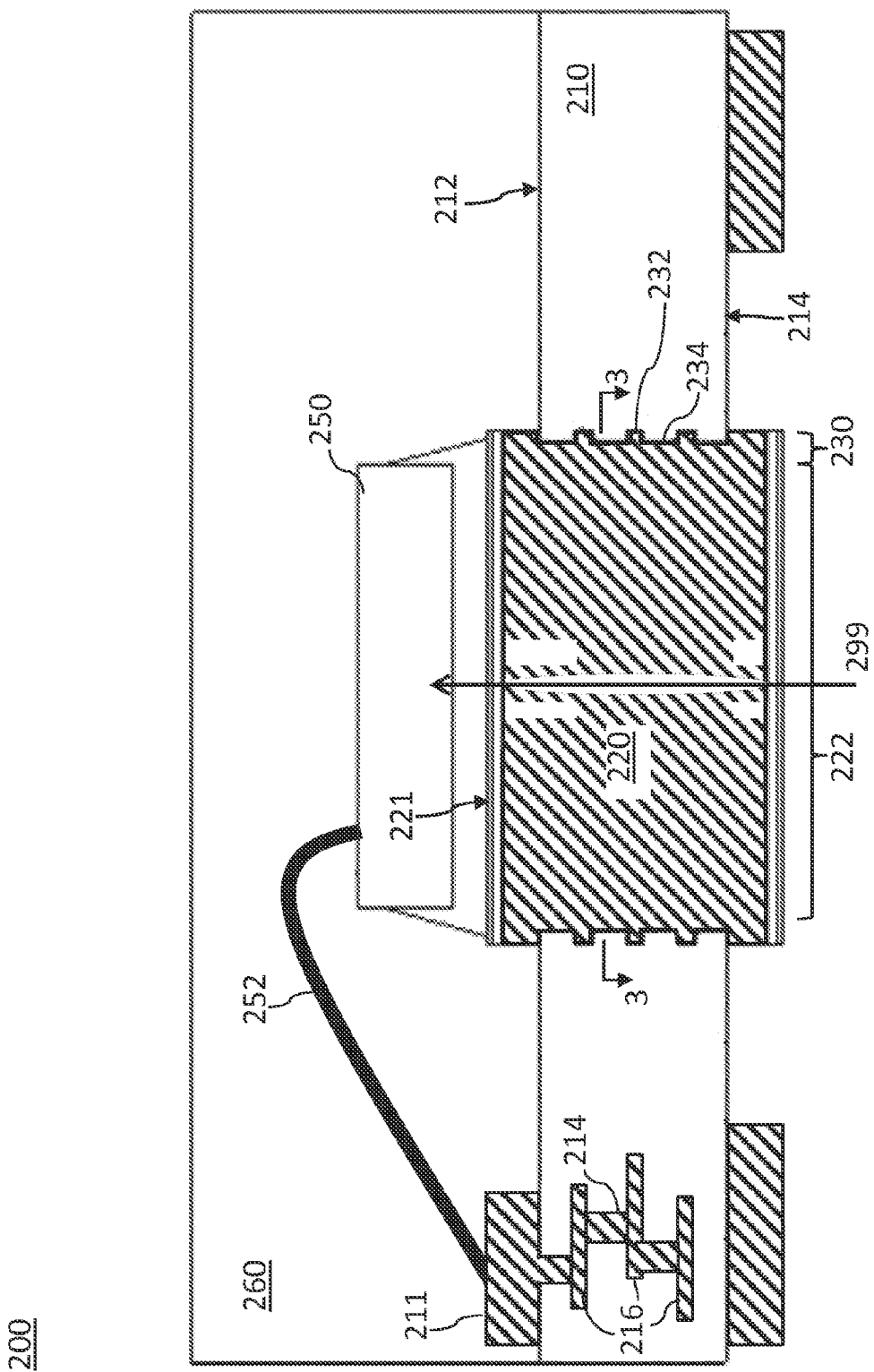
FIG. 2A illustrates a diagrammatic cross sectional view of a semiconductor package.

FIG. 2A illustrates a diagrammatic cross sectional view of the semiconductor package 200. The semiconductor package 200 may comprise a semiconductor die 250, a thermal pad 220, a substrate 210, and a body 260. The thermal pad 220 may comprise a heat dissipating portion 222, and an interlock structure 230. The substrate 210 may comprise a plurality of vias 214, a wire bond pad 211 and a plurality of metal layers 216.

The semiconductor die 250 may be electrically connected to the wire bond pad 211 with the wire bond 252. The semiconductor die 250 may be disposed on a pad surface 221 of the thermal pad 220. The plurality of metal layers 216 may be electrically connected to the semiconductor die 250. The plurality of vias 214 may be conducting pathways that provide electrical interconnect between the plurality of metal layers 216 of the substrate 210. The thermal pad 220 may be different from the plurality of vias 214 in two ways. Firstly, the thermal pad 220 may be substantially larger than each of the plurality of vias 214 in term of cross sectional area. In the embodiment shown in FIG. 2A, the thermal pad 220 may be at least 10 times larger than each of the plurality of vias 214 in term of cross sectional area. Secondly, the thermal pad 220 may be extending through the entire substrate 210 unlike each of the plurality of vias 214 which only extends between two of the plurality of metal layers 216. Using the plurality of vias 214 as a means to dissipate heat from the semiconductor die 250 may be inadequate.

The interlock structure 230 may be arranged in a corrugated manner as shown in FIG. 2A so as to facilitate the mechanical interlock between the thermal pad 220 and the substrate 210. The interlock structure 230 may comprise a plurality of ridges 232 and a plurality of grooves 234. The thermal pad 220 may be interlocked with the substrate 210 by the interlock structure 230 so that the thermal pad 220 may be prevented from being dislodged from the substrate 210. Each of the plurality of ridges 232 may be projecting axially away from a central axis 299 that extends perpendicularly to the pad surface 221 towards the substrate 210. Each of the plurality of ridges 232 and grooves 234 may be configured to engage the substrate 210 so as to produce mechanical interlock between the substrate 210 and the thermal pad 220. The corrugated manner of the interlock structure 230 with the plurality of ridges and grooves 232, 234 may enable the interlock structure 230 to have more surface areas to engage the substrate 210 so as to improve mechanical interlock between the thermal pad 220 and the substrate 210.

The heat dissipating portion 222 is a portion of the thermal pad 220 that may be configured to dissipate a majority of heat from the semiconductor die 250. In other words, a substantial amount of heat may be dissipated through the heat dissipating portion 222. For example, in the embodiment shown in FIG. 2A, at least 80% of heat may be dissipated through the heat dissipating portion 222.

Figure 2B:
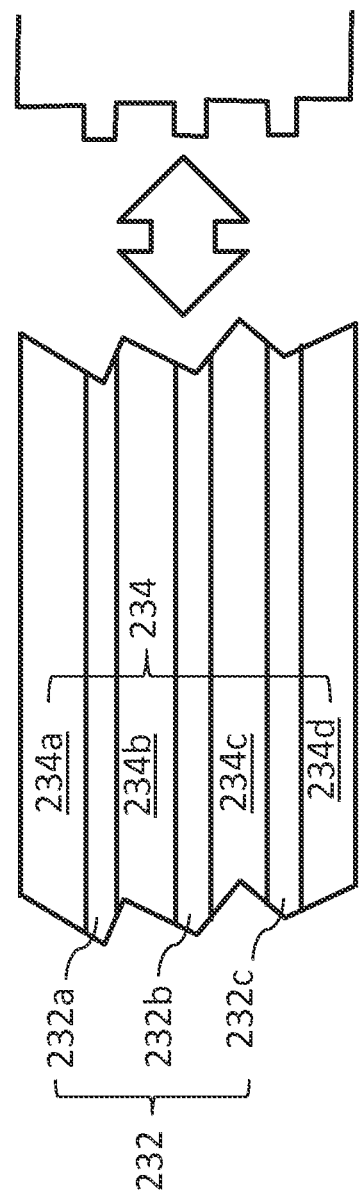
FIG. 2B illustrates a diagrammatic side view of a thermal pad of the semiconductor package shown in FIG. 2A.

FIG. 2B illustrates a diagrammatic side view of the interlock structure 230 shown in FIG. 2A. Referring to FIG. 2B, each of the plurality of ridges 232 and the plurality of grooves 234 may be substantially parallel to each other. The plurality of ridges 232 may comprise ridges 232a, 232b, 232c. The plurality of grooves 234 may comprise grooves 234a, 234b, 234c, 234d. The plurality of ridges 232 and the plurality of grooves 234 may be arranged in an alternating configuration. For example, as shown in FIG. 2B, the ridge 232a may be sandwiched by the grooves 234a, 234b. The groove 234c may be sandwiched by the ridges 232b, 232c. By having alternating configuration of the interlock structure 230, two of the plurality of ridges 232 may produce a clamping mechanism on a portion of the substrate 210 that is located at one of the plurality of grooves 234 thereby increasing the mechanical interlock between the thermal pad 220 and the substrate 210. In one embodiment, the ridges 232 may comprise a cantilever. In another embodiment, the ridges 232 may comprise a protuberance.

Figure 2C:
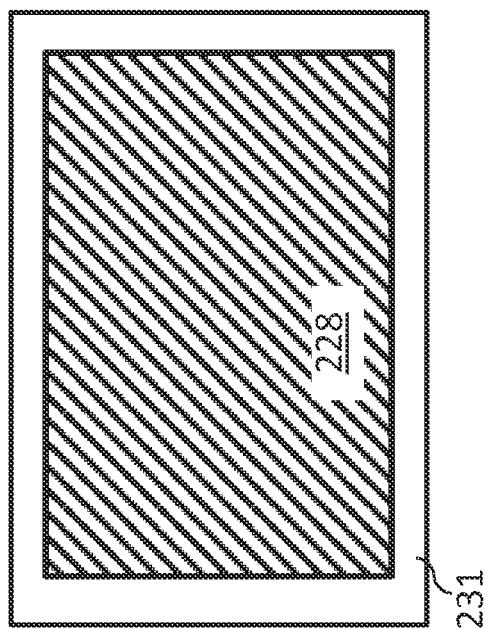
FIG. 2C illustrates a diagrammatic cross sectional view taken from the line 33 of the thermal pad shown in FIG. 2A.

FIG. 2C illustrates a diagrammatic cross sectional view of the interlock structure 230 taken from the line 3-3 shown in FIG. 2A. Referring to FIGS. 2A and 2C, the thermal pad 220 may comprise of the interlock structure 230 and the heat dissipating portion 222. The thermal pad 220 may have a heat dissipating area 228 of the heat dissipating portion 222 taken along the cross-sectional plane 3-3 that is substantially parallel to the substrate 210. The heat dissipating area 228 is illustrated as a shaded area in FIG. 2C. The interlock structure 230 has an interlock area 231 taken along the cross sectional plane 3-3. The interlock area 231 of the interlock structure 230 is illustrated as an area surrounding the heat dissipating area 228 that is not shaded in FIG. 2C.

The heat dissipating portion 222 may be substantially larger in terms of cross sectional area than the interlock structure 230. For example, the heat dissipating area 228 of the heat dissipating portion 222 may be at least 10 times larger than the interlock area 231 of the interlock structure 230. In one embodiment, the heat dissipating area 228 of the heat dissipating portion 222 may be at least 5 times larger than the interlock area 231 of the interlock structure 230.

A larger heat dissipating area 228 relative to the interlock area 231 may enable more heat to be dissipated from the semiconductor die 250. The corrugated manner of the interlock structure 230 enables the interlock structure 230 to have more surface areas to engage the substrate 210 vertically along the central axis 299 without occupying space horizontally. The design of the thermal pad shown in FIG. 2A provides a stronger interlock between the thermal pad 220 and the substrate 210 while improving heat dissipation from the semiconductor die 250.

FIG. 2D illustrates a diagrammatic top view of the substrate 210 without showing the semiconductor die 250 and the wire bond pad 211. Referring to FIGS. 2A and 2D, the thermal pad 220 may comprise a pad surface 221. The semiconductor die 250 may be disposed on the pad surface 221 of the thermal pad 220. The substrate 210 may comprise an external surface 212. The external surface 212 may be substantially parallel with the pad surface 221 of the thermal pad 220.

An area of the pad surface 221 is shown as a shaded area in FIG. 2D. An area of the external surface 212 is shown as an area in FIG. 2D that is not shaded and surrounding the area of pad surface 221. The area of the pad surface 221 is approximately 10% to 40% of an area of the external surface 212 of the substrate 210. When the area of pad surface 221 is larger than 40% of the area of the external surface 212 by more than 40%, the substrate 210 may break during the reliability test of the semiconductor package 200. When the area of pad surface 221 is smaller than 10% of the area of the external surface 212, the amount heat of heat flow dissipated through the thermal pad 220 is inadequate. Therefore, by having the area of the pad surface 221 of the thermal pad 220 to be larger than 10% but smaller than 40% of the area of the external surface 212 of the substrate 210, heat flow from the semiconductor die 250 can be dissipated efficiently without compromising the structural integrity of the substrate 210.

Figure 3:
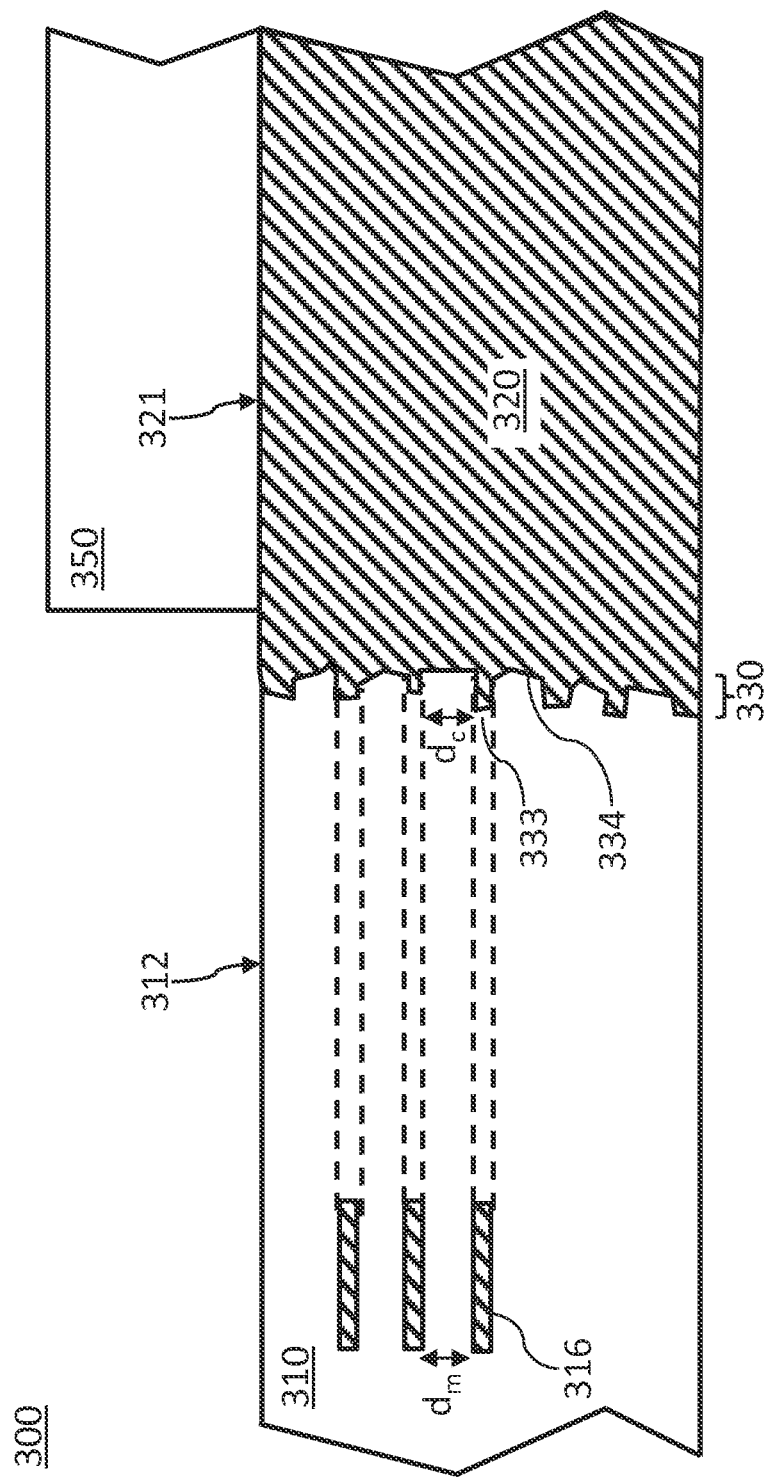
FIG. 3 illustrates a diagrammatic cross sectional view of a semiconductor package with a cantilever.

FIG. 3 illustrates a diagrammatic cross sectional view of a semiconductor package 300 with a cantilever 333. Referring to FIG. 3, the semiconductor package 300 may comprise a thermal pad 320 and a substrate 310. The substrate 310 may comprise a plurality of metal layers 316.

The thermal pad 320 may comprise a cantilever 333 and a groove 334. The cantilever 333 may have a well defined edges and shape. The cantilever 333 may have a cross sectional shape that is more distinctly a rectangle, a square or a triangle. The cantilever 333 may be projecting outwardly from the thermal pad 320. The cantilever 333 may be arranged corresponding to each layer of the plurality of metal layers 316 of the substrate 310. The cantilever 333 may be planarly parallel with one layer of the plurality of metal layers 316. The cantilever 333 may be separated from one another by a cantilever gap $d_c$. Each of the plurality of metal layers 316 may be spaced apart from one another by a gap $d_m$. The cantilever gap $d_c$ may be substantially equal to the gap $d_m$ (e.g., within machining tolerances).

The thermal pad 320 may comprise a pad surface 321 where the semiconductor die 350 may be disposed on. The substrate 310 may comprise a first external surface 312. In the embodiment shown in FIG. 3, the first external surface 312 of the substrate 310 may be coplanar with the pad surface 321 of the thermal pad 320. The interlock structure 330 may reside within the substrate 310.

Figure 4A:
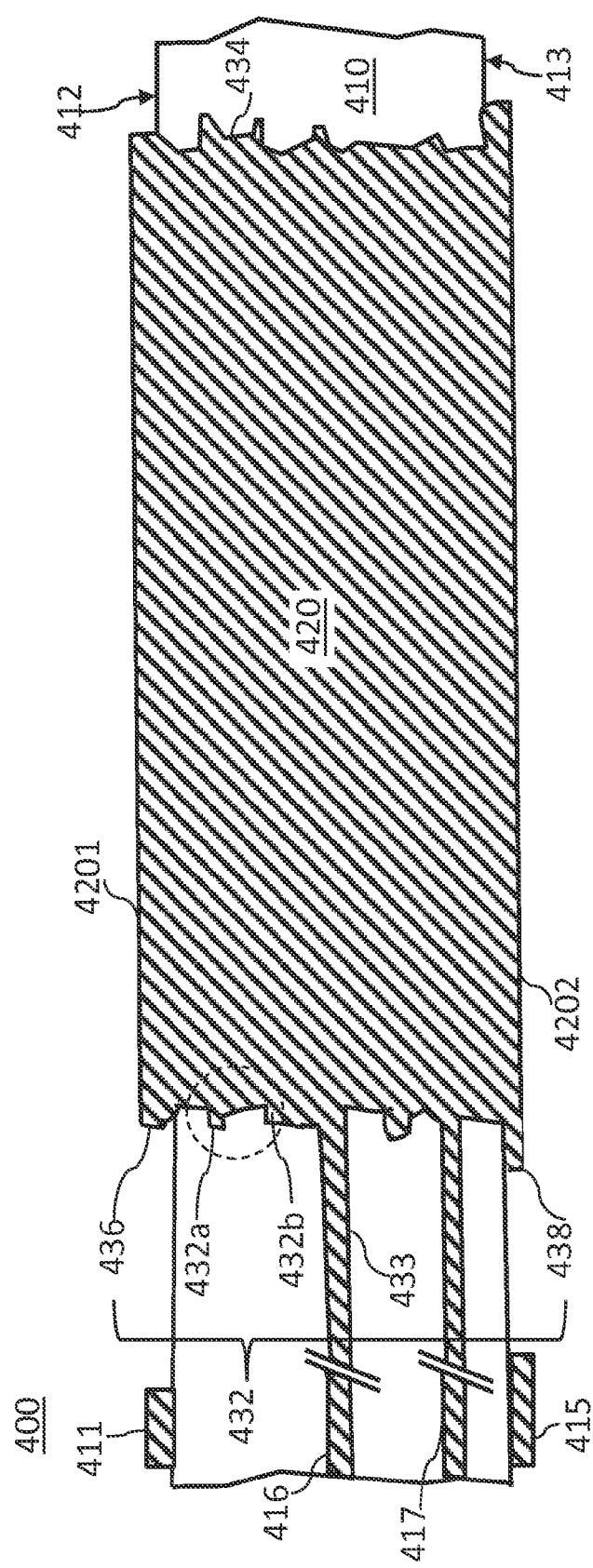
FIG. 4A illustrates a diagrammatic cross sectional view of a semiconductor package with a cantilever connected to one of the plurality of metal layers.
Figure 4B:
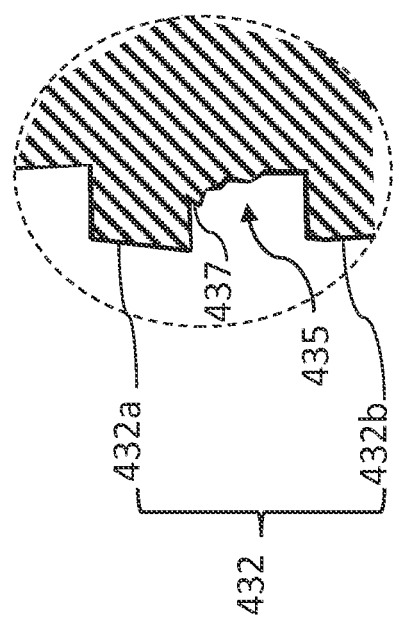
FIG. 4B illustrates a diagrammatic exploded view of a portion of a thermal pad of the semiconductor package shown in FIG. 4A.

FIG. 4A illustrates a diagrammatic cross sectional view of a semiconductor package 400 with a cantilever 433 connected to one member 416 of a plurality of metal layers 416, 417. FIG. 4A also illustrates a first surface cantilever 436 and a second surface cantilever 438 which are overhanging structures of a thermal pad 420 to engage first and second external surfaces 412, 413 of a substrate 410. FIG. 4B illustrates a diagrammatic exploded view of a portion of a thermal pad 420 of the semiconductor package 400 shown in FIG. 4A.

Referring to FIG. 4A, the thermal pad 420 may comprise a plurality of ridges 432 and a plurality of grooves 434. The plurality of ridges 432 may comprise a cantilever 433, a first surface cantilever 436, and a second surface cantilever 438. The cantilever 433 may extend and may be connected to one member 416 of the plurality of metal layers 416, 417. The plurality of metal layers 416, 417 may comprise an electrical ground trace 417.

The second external surface 413 of the substrate 410 may be opposing the first external surface 412 of the substrate 410. The substrate 410 may also comprise a wire bond pad 411 and a solder pad 415. The wire bond pad 411 may be disposed on the first external surface 412 of the substrate 410. The solder pad 415 may be disposed on the second external surface 413 of the substrate 410.

The thermal pad 420 may extend through the substrate 410. The thermal pad 420 may comprise of a first portion 4201 and a second portion 4202. The first portion 4201 of the thermal pad 420 may extend beyond the first external surface 412 of the substrate 410. The second portion 4202 of the thermal pad 420 may extend beyond the second external surface 413 of the substrate 410. The first surface cantilever 436 may be projecting from the first portion 4201 of the thermal pad 420 in a direction parallel with the first external surface 412 of the substrate 410. The first surface cantilever 436 may be engaging a portion of the first external surface 412. The first surface cantilever 436 may be arranged corresponding to the wire bond pad 411. The first surface cantilever 436 may be planarly parallel with the wire bond pad 411.

The second surface cantilever 438 may be projecting from the second portion 4202 of the thermal pad 420 in a direction parallel with the second external surface 413 of the substrate 410. The second surface cantilever 438 may be engaging a portion of the second external surface 413. The second surface cantilever 438 may be arranged corresponding to the solder pad 415 on the second external surface 413 of the substrate 410. The second surface cantilever 438 may be planarly parallel with the solder pad 415. The first surface cantilever 436 and the second surface cantilever 438 may be engaging the first and second external surfaces 412, 413 of the substrate 410 to produce a clamping mechanism such that the thermal pad 420 may prevented from being dislodged from the substrate 410.

FIG. 4B illustrates a diagrammatic exploded view a portion of the thermal pad 420. Referring to FIG. 4B, each of the plurality of grooves 434 may comprise a roughened surface 435. The roughened surface 435 may be sandwiched between two neighboring ridges 432a, 432b. The roughened surface 435 may be an uneven surface that is produced as a result of a laser drilling process during the manufacturing of the thermal pad 420. The roughened surface 435 may provide additional resistance that prevents the thermal pad 420 to move against the substrate 410 thereby improving the mechanical interlock between the thermal pad 420 and the substrate 410.

The roughened surface 435 may comprise a burr 437. The burr 437 may be an irregular shaped edge that is microscopic. The burr 437 may be visible by using a microscope but not visible to naked human eyes. The burr 437 may be connected one of the two neighboring ridges 432a, 432b. The burr 437 may be produced as a result of metal surface grinding process during the manufacturing process of the thermal pad 420. The manufacturing process of the semiconductor package 400 will be further elaborated in the discussion on FIG. 6C.

Figure 5:
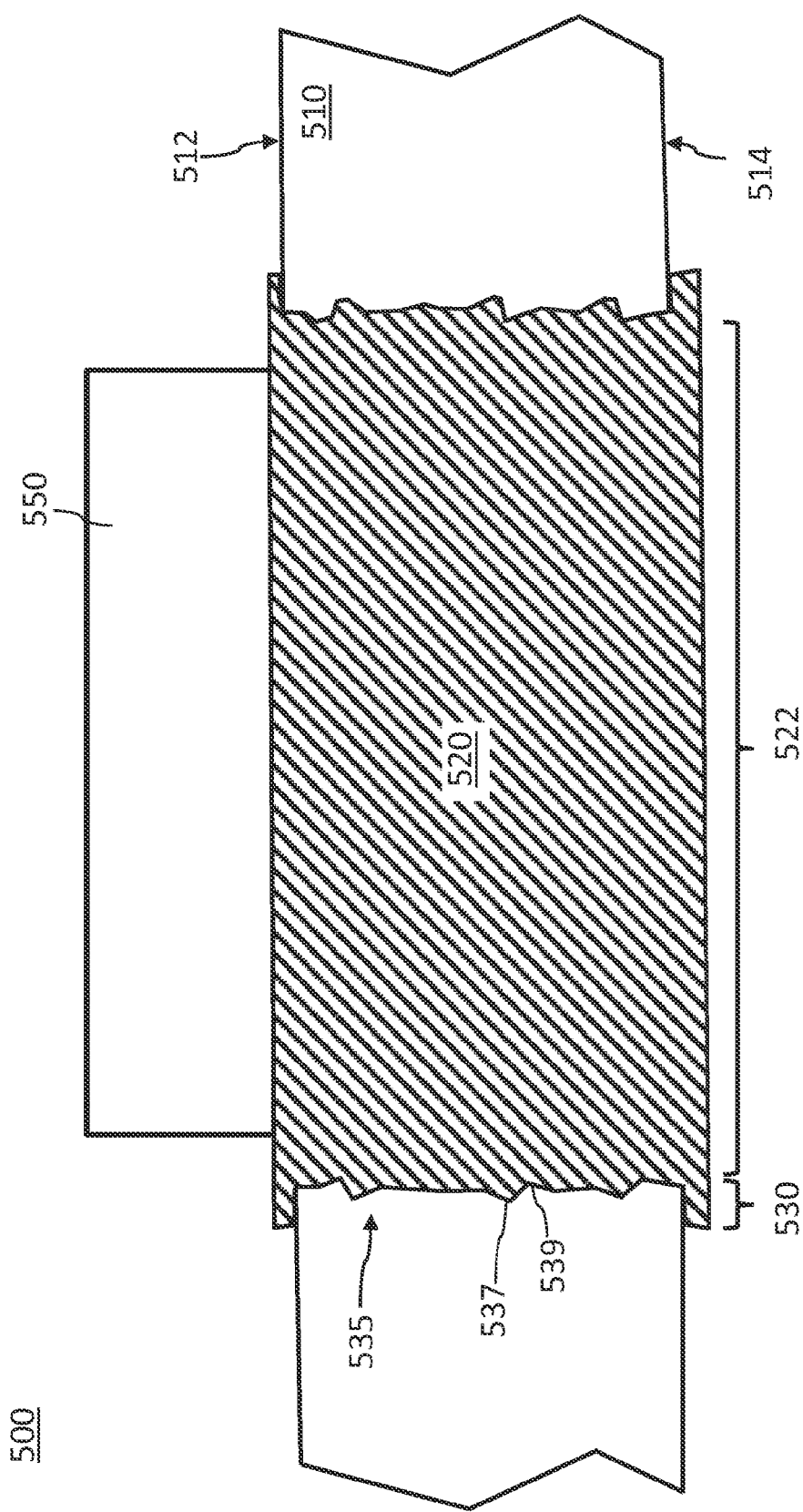
FIG. 5 illustrates a diagrammatic cross sectional view of a semiconductor package with a protuberance.

FIG. 5 illustrates a diagrammatic cross sectional view of a semiconductor package 500 with a protuberance 537. Referring to FIG. 5, the semiconductor package 500 may comprise a circuit board 510, a thermal pad 520, and a semiconductor die 550. The thermal pad 520 may comprise an interlock structure 530 and a heat conductive body 522. All components of the semiconductor package 500 that are in common with the semiconductor package 100, 200, 300, 400 may share similar characteristics or may be identical.

The circuit board 510 may comprise a first main surface 512 and an opposing second main surface 514. The thermal pad 520 may be extending through the circuit board 510. The interlock structure 530 may be formed on a side surface 535. The side surface 535 may be intersecting the first and second main surfaces 512, 514 of the circuit board 510. The side surface 535 of the thermal pad 520 may be in direct contact with the circuit board 510. The interlock structure 530 may extend from the first main surface 512 to the second main surface 514 of the circuit board 510 so as to provide a mechanical interlock between the thermal pad 520 and the circuit board 510. The semiconductor die 550 may be disposed on the thermal pad 520. The thermal pad 520 may be configured to dissipate heat from the semiconductor die 550.

The interlock structure 530 may comprise a roughened surface 535. The roughened surface 535 may be the side surface 535 that has an irregular surface profile. The roughened surface 535 may comprise the protuberance 537 and an indentation 539. The protuberance 537 may be a structure that protrudes from something else. The protuberance 537 is an engaging portion of the interlock structure 530 so as to establish mechanical interlock between the thermal pad 520 and the circuit board 510. The protuberance 537 may be an irregular shape ridge. The protuberance 537 may not have well defined edges. The protuberance 537 may not have fix cross sectional shape. The protuberance 537 may be surrounded by the indentation 539.

Figure 6B:
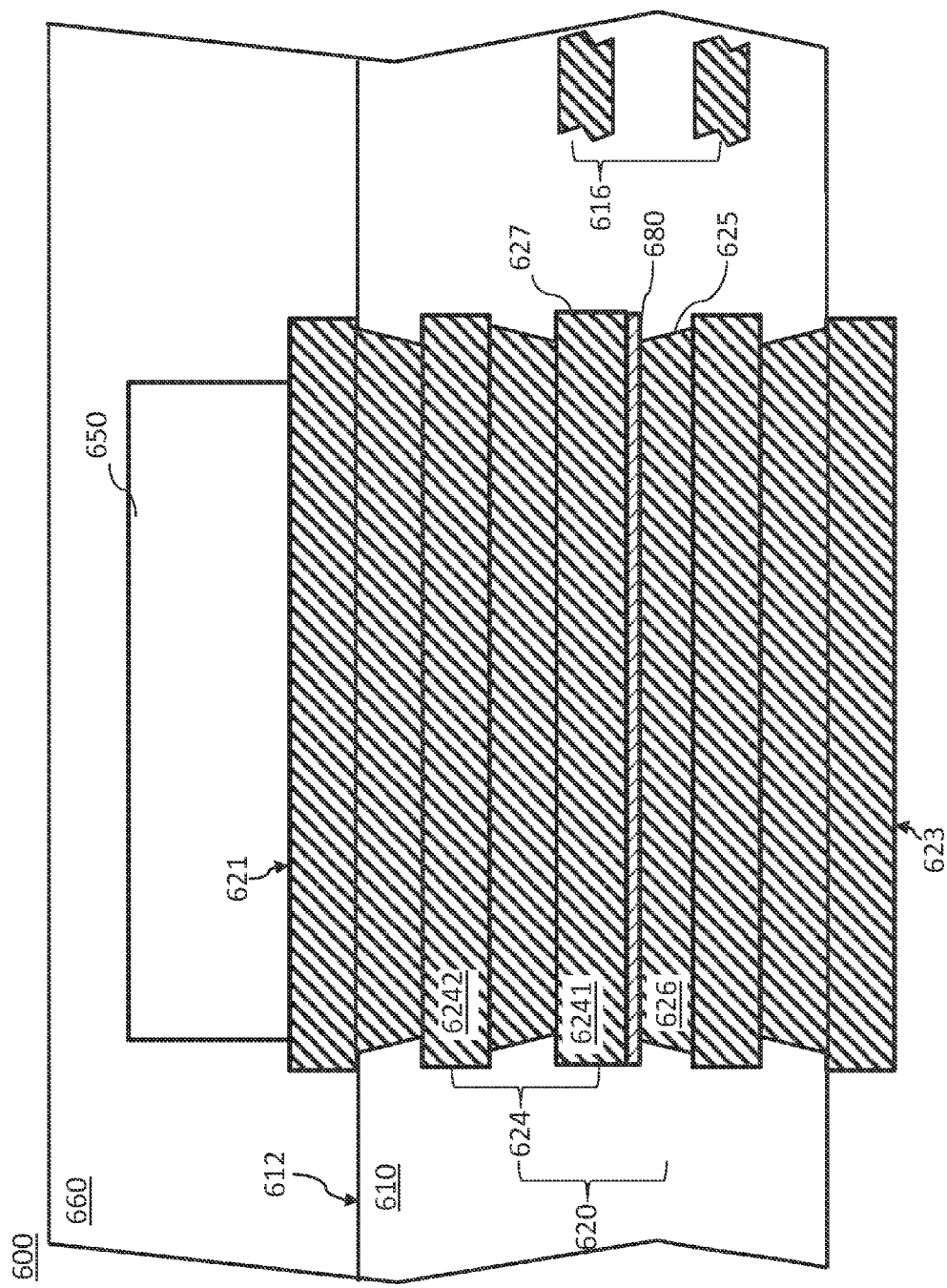
FIG. 6B illustrates a diagrammatic cross sectional view of a semiconductor package of the wireless communication device.

Referring to FIGS. 6A-6B, a wireless communication device 601 may comprise a semiconductor package 600. The wireless communication device 601 may be a mobile communication device, a wearable communication device, or other devices that are communicating wirelessly. The wireless communication device 601 may comprise a circuit board 610, a thermal pad 620, a semiconductor die 650, and a body 660. The body 660 may be encapsulating the semiconductor die 650.

FIG. 6B illustrates a semiconductor package 600 with a plurality of filled up metal layers and cantilever layers 626, 624. The thermal pad 620 may be extending through the circuit board 610. The thermal pad 620 may comprise the plurality of cantilever layers 624. The plurality of cantilever layers 624 of the thermal pad 620 may be arranged in accordance with a plurality of metal layers 616 of the circuit board 610. The plurality of cantilever layers 624 and the plurality of metal layers 616 may be formed using the same metal deposition process.

The thermal pad 620 may also comprise the plurality of filled up metal layers 626. The plurality of filled up metal layers 626 of the thermal pad 620 may be sandwiched between the plurality of cantilever layers 624 of the thermal pad 620. The plurality of filled up metal layers 626 and the plurality of cantilever layers 624 may be formed layer by layer. Further elaboration on the formation of the plurality of filled up metal layers 626 and the plurality of cantilever layers 624 can be found in the discussion on FIG. 6C. By forming the plurality of filled up metal layers 626 and the cantilever layers 624 layer by layer, a large mass of a thermal conductive material may be deposited to form the thermal pad 620. The layer by layer formation also enables each layer's thickness and position to be controlled in order to form a corrugated structure so as to mechanically engage the thermal pad 620 and the circuit board 610.

The semiconductor die 650 may be disposed on the thermal pad 620. The thermal pad 620 may be configured to dissipate heat from the semiconductor die 650. Each of the plurality of filled up metal layers 626 may comprise a side filled up surface 625. The side filled up surface 625 may be extending between the two adjacent cantilever layers 624. Each of the plurality of cantilever layers 624 may comprise a side cantilever surface 627.

The side cantilever surface 627 may be extending between two adjacent filled up metal layers 626. The side cantilever surface 627 and the side filled up surface 625 may be oriented in a zig-zag manner as illustrated in FIG. 6B. The side cantilever surface 627 may be perpendicular to a first external surface 612 of the circuit board 610. The side filled up surface 625 may be tilted and not parallel to the side cantilever surface 627. By having the side filled up surface 625 and the side cantilever surface 627 in the zig-zag manner, mechanical interlock between the thermal pad 620 and the circuit board 610 may be established.

The thermal pad 620 may comprise a first pad surface 621 and an opposing second pad surface 623. The semiconductor die 650 may be disposed on the first pad surface 621 of the thermal pad 620. The plurality of cantilever layers 624 may comprise first and second cantilever layers 6241, 6242. The first cantilever layer 6241 may be disposed in the middle between the first pad surface 621 and the second pad surface 623.

The thermal pad 620 may comprise an etch stop layer 680. The etch stop layer 680 may be sandwiched between one of the plurality of cantilever layers 624 and one of the plurality of filled up metal layers 626. The etch stop layer 680 may located in between but distanced away from both the first pad surface 621 and the opposing second pad surface 623. The etch stop layer 680 may be disposed in direct contact with the first cantilever layer 6241 as illustrated in FIG. 6B. The etch stop layer 680 may extend parallel to one of the plurality of cantilever layers 624.

The etch stop layer 680 may be used during the manufacturing process of the thermal pad 620. The thermal pad 620 may be formed by depositing metals layer by layer. A carrier layer (not shown) may be used a starting layer where subsequent metal layers and dielectric layers are built upon. After some metal layers and dielectric layers have been deposited, the carrier layer (not shown) may be removed by an etching process. The etch stop layer 680 may be made from a non-etch-able material such that the etch stop layer 680 may protect the metal layer from being etched away during the removal of the carrier (not shown). The etch stop layer 680 may comprise of nickel or any other material that has a stronger resistance to etching than copper.

Figure 6C:
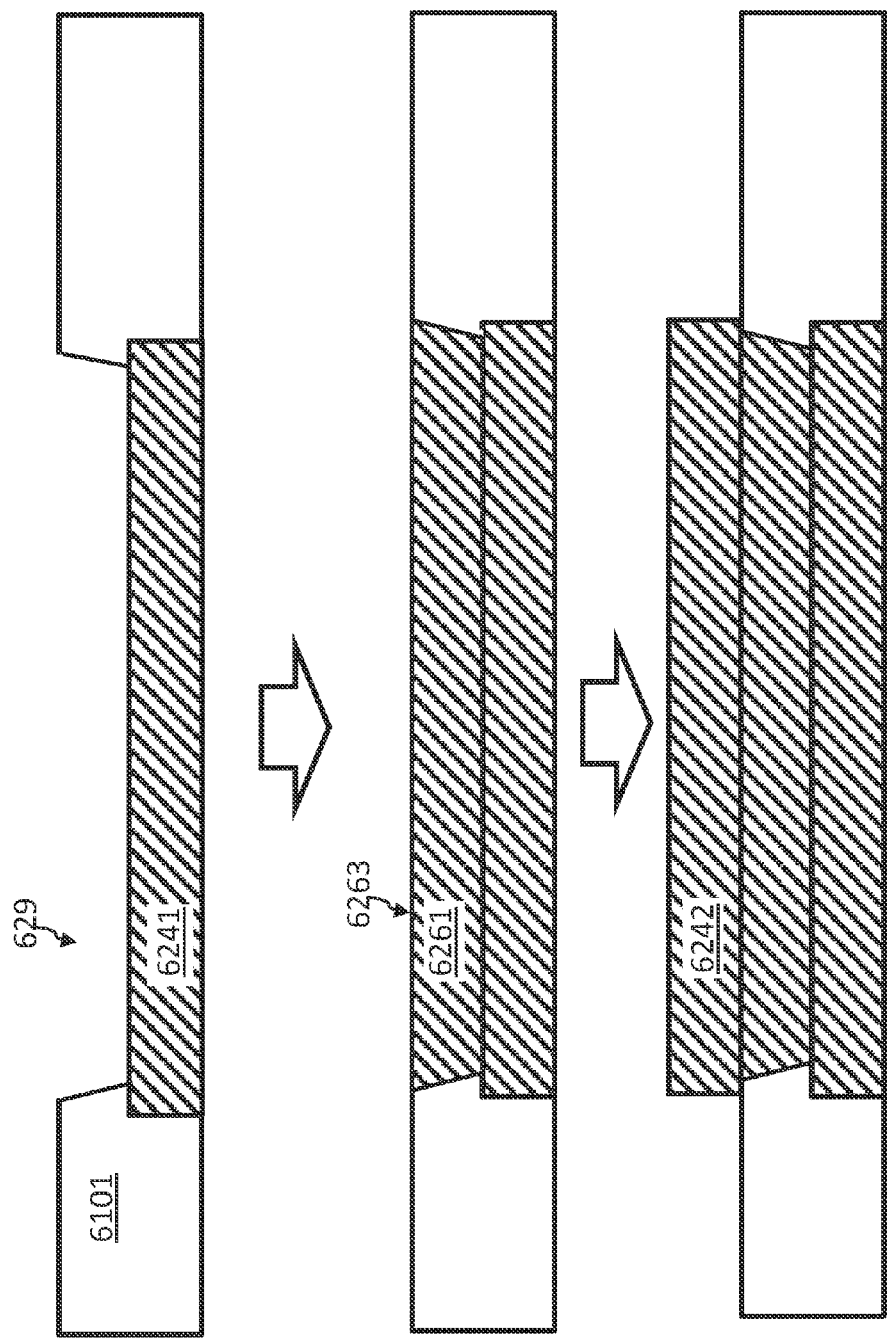
FIG. 6C illustrates a diagrammatic view of a manufacturing process of a cantilever layer and a filled up metal layer of the semiconductor package in FIG. 6B.

Referring to FIG. 6C, key steps of a manufacturing process of the semiconductor package 600 are illustrated. The thermal pad 620 may be formed layer by layer with the first cantilever layer 6241 serves as a first metal layer. A layer of dielectric material 6101 may be formed on top of the first cantilever layer 6241. A portion of the layer of dielectric material 6101 on top of the first cantilever layer 6241 may be drilled with a laser drilling process, thereby producing a hole 629. The hole 629 may be deposited with metals. The deposition of metals produces a first filled up metal layer 6261. An upper surface 6263 of the first filled up metal layer 6261 is then subjected to a grinding process or the like to smooth the upper surface 6263 before next metal layer is deposited. The grinding process may produce a burr that is elaborated in the discussion of FIG. 4B. After the grinding process is completed, another layer of metal is deposited on top of the first filled up metal layers 6261 thereby producing the second cantilever layer 6242. This process may then be repeated until a desired number of plurality of filled up metal layers and cantilever layers 624, 626 are achieved.

Different aspects, embodiments or implementations may, but need not, yield one or more of the advantages. For example, by having an interlock structure of the thermal pad engaging the substrate, the thermal pad may be secured in position with respect to the substrate such that undesirable dislocations of the thermal pad may be prevented. Another example is by having the first and second surface cantilevers, the thermal pad may produce clamping mechanism on the substrate such that the mechanical interlock between the thermal pad and the substrate is improved.

Although specific embodiments of the invention have been described and illustrated herein above, the invention should not be limited to any specific forms or arrangements of parts so described and illustrated. For example, the thermal pad described above may be made from copper, aluminum or other thermally conductive materials. Similarly, although certain orientation terms such as "parallel" or "middle" were used, the scope should not be limited to such orientation. The scope of the invention is to be defined by the claims.

What is claimed is:

1. A semiconductor package, comprising:
a substrate;
a thermal pad having a heat conductive body extending through the substrate;
a semiconductor die disposed on the thermal pad and in thermal communication with the thermal pad thereby enabling the thermal pad to dissipate heat away from the semiconductor die; and
an interlock structure serving as an interface between the substrate and thermal pad so as to provide a mechanical interlock between the thermal pad and the substrate, wherein the thermal pad comprises an etch-able material, and an etch stop layer is disposed within the thermal pad.

2. The semiconductor package of claim 1, wherein the interlock structure is substantially smaller than the heat conductive body of the thermal pad in size.

3. The semiconductor package of claim 1, wherein:
the substrate comprises a plurality of metal layers electrically coupled to the semiconductor die; and
a plurality of vias interconnecting two of the plurality of metal layers, wherein the thermal pad is substantially larger than each of the plurality of vias in size.

4. The semiconductor package of claim 1, wherein:
the thermal pad has a heat dissipating area taken along a cross-sectional plane substantially parallel to the substrate; and
the interlock structure has an interlock area taken along the cross-sectional plane, wherein the interlock area is substantially smaller than the heat dissipating area.

5. The semiconductor package of claim 1, wherein the thermal pad comprises the interlock structure and a heat dissipating portion, wherein the heat dissipating portion is at least 10 times larger than the interlock structure.

6. The semiconductor package of claim 1, wherein the interlock structure comprises a plurality of ridges and a plurality of grooves arranged in a corrugated manner that facilitate the mechanical interlock between the thermal pad and the substrate.

7. The semiconductor package of claim 6, wherein each of the plurality of ridges and the plurality of grooves are substantially parallel to each other.

8. The semiconductor package of claim 6, wherein the plurality of ridges and the plurality of grooves are arranged in an alternating configuration.

9. The semiconductor package of claim 6, wherein:
the substrate comprises a plurality of metal layers; and
each of the plurality of ridges comprises a cantilever projecting outwardly from the thermal pad, wherein the cantilever is arranged corresponding to one layer of the plurality of the metal layers of the substrate.

10. The semiconductor package of claim 9, wherein the cantilever extends and is connected to the one layer of the plurality of the metal layers.

11. The semiconductor package of claim 9, wherein the substrate comprises a first external surface, and the plurality of ridges comprises a first surface cantilever engaging a portion of the first external surface.

12. The semiconductor package of claim 11, wherein the substrate comprises a second external surface arranged opposing the first external surface, and the plurality of ridges comprises a second surface cantilever engaging a portion of the second external surface.

13. The semiconductor package of claim 6, wherein each of the plurality of grooves comprises a roughened surface sandwiched between two neighboring ridges.

14. The semiconductor package of claim 13, wherein the roughened surface comprises a burr connected to one of the two neighboring ridges.

15. A semiconductor package, comprising:
a circuit board including a first main surface and an opposing second main surface;
a thermal pad extending through the circuit board;
an interlock structure formed on a side surface intersecting the first main surface and the opposing second main surface of the thermal pad, wherein the interlock structure extends from the first main surface to the opposing second main surface of the circuit board so as to provide a mechanical interlock between the thermal pad and the circuit board; and
a semiconductor die disposed on the thermal pad.

16. The semiconductor package of claim 15, wherein the interlock structure comprises a roughened surface that intersects the first main surface and the opposing second main surface.

17. The semiconductor package of claim 16, wherein the roughened surface comprises a protuberance projecting from the roughened surface of the thermal pad to engage the circuit board.

18. The semiconductor package of claim 17, wherein the roughened surface comprises an indentation surrounding the protuberance.

19. A wireless communication device, comprising:
a circuit board having a plurality of metal layers;
a thermal pad extending through the circuit board, wherein the thermal pad comprises a plurality of cantilever layers arranged in accordance with the plurality of metal layers, and a plurality of filled up metal layers formed between the plurality of cantilever layers; and
a semiconductor die disposed on the thermal pad, wherein the plurality of cantilever layers and the plurality of filled up metal layers form a corrugated structure so as to mechanically engage the thermal pad with the circuit board.

20. The wireless communication device of claim 19, wherein:
each of the plurality of filled up metal layers comprises a side filled up surface extending between two adjacent cantilever layers;
each of the plurality of cantilever layers comprises a side cantilever surface extending between two adjacent filled up metal layers; and
the side cantilever surface and the side filled up surface are oriented in a zig-zag manner.

21. A semiconductor package, comprising:
a substrate;
a thermal pad having a heat conductive body extending through the substrate;
a semiconductor die disposed on the thermal pad and in thermal communication with the thermal pad thereby enabling the thermal pad to dissipate heat away from the semiconductor die, the substrate comprising a plurality of metal layers electrically coupled to the semiconductor die;

an interlock structure serving as an interface between the substrate and thermal pad so as to provide a mechanical interlock between the thermal pad and the substrate; and a plurality of vias interconnecting two of the plurality of metal layers, wherein the thermal pad is substantially larger than each of the plurality of vias in size.

22. The semiconductor package of claim 21, wherein the interlock structure is substantially smaller than the heat conductive body of the thermal pad in size.

23. The semiconductor package of claim 21, wherein the thermal pad comprises an etch-able material, and the thermal pad comprises an etch stop layer formed within the thermal pad that comprises a non-etch-able material.

24. The semiconductor package of claim 21, wherein:
the thermal pad has a heat dissipating area taken along a cross-sectional plane substantially parallel to the substrate; and
the interlock structure has an interlock area taken along the cross-sectional plane, wherein the interlock area is substantially smaller than the heat dissipating area.

25. The semiconductor package of claim 21, wherein the thermal pad comprises the interlock structure and a heat dissipating portion, wherein the heat dissipating portion is at least 10 times larger than the interlock structure.

26. The semiconductor package of claim 21, wherein the interlock structure comprises a plurality of ridges and a plurality of grooves arranged in a corrugated manner that facilitate the mechanical interlock between the thermal pad and the substrate.

27. The semiconductor package of claim 26, wherein each of the plurality of ridges and the plurality of grooves are substantially parallel to each other.

28. The semiconductor package of claim 26, wherein the plurality of ridges and the plurality of grooves are arranged in an alternating configuration.

29. The semiconductor package of claim 26, wherein:
each of the plurality of ridges comprises a cantilever projecting outwardly from the thermal pad, wherein the cantilever is arranged corresponding to one layer of the plurality of the metal layers of the substrate.

30. The semiconductor package of claim 29, wherein the cantilever extends and is connected to the one layer of the plurality of the metal layers.

31. The semiconductor package of claim 29, wherein the substrate comprises a first external surface, and the plurality of ridges comprises a first surface cantilever engaging a portion of the first external surface.

32. The semiconductor package of claim 31, wherein the substrate comprises a second external surface arranged opposing the first external surface, and the plurality of ridges comprises a second surface cantilever engaging a portion of the second external surface.

33. The semiconductor package of claim 32, wherein each of the plurality of grooves comprises a roughened surface sandwiched between two neighboring ridges.

34. The semiconductor package of claim 33, wherein the roughened surface comprises a burr connected to one of the two neighboring ridges.

35. A semiconductor package, comprising:
a substrate;
a thermal pad having a heat conductive body extending through the substrate, wherein the thermal pad has a heat dissipating area taken along a cross-sectional plane substantially parallel to the substrate;
a semiconductor die disposed on the thermal pad and in thermal communication with the thermal pad thereby enabling the thermal pad to dissipate heat away from the semiconductor die; and
an interlock structure serving as an interface between the substrate and thermal pad so as to provide a mechanical interlock between the thermal pad and the substrate, the interlock structure having an interlock area taken along the cross-sectional plane, wherein the interlock area is substantially smaller than the heat dissipating area.

36. The semiconductor package of claim 35, wherein the interlock structure is substantially smaller than the heat conductive body of the thermal pad in size.

37. The semiconductor package of claim 35, wherein:
the substrate comprises a plurality of metal layers electrically coupled to the semiconductor die; and
a plurality of vias interconnecting two of the plurality of metal layers, wherein the thermal pad is substantially larger than each of the plurality of vias in size.

38. The semiconductor package of claim 35, wherein the thermal pad comprises the interlock structure and a heat dissipating portion, wherein the heat dissipating portion is at least 10 times larger than the interlock structure.

39. The semiconductor package of claim 35 wherein the interlock structure comprises a plurality of ridges and a plurality of grooves arranged in a corrugated manner that facilitate the mechanical interlock between the thermal pad and the substrate.

40. The semiconductor package of claim 39, wherein each of the plurality of ridges and the plurality of grooves are substantially parallel to each other.

41. The semiconductor package of claim 39, wherein the plurality of ridges and the plurality of grooves are arranged in an alternating configuration.

42. The semiconductor package of claim 41, wherein:
the substrate comprises a plurality of metal layers; and
each of the plurality of ridges comprises a cantilever projecting outwardly from the thermal pad, wherein the cantilever is arranged corresponding to one layer of the plurality of the metal layers of the substrate.

43. The semiconductor package of claim 42, wherein the cantilever extends and is connected to the one layer of the plurality of the metal layers.

44. The semiconductor package of claim 42, wherein the substrate comprises a first external surface, and the plurality of ridges comprises a first surface cantilever engaging a portion of the first external surface.

45. The semiconductor package of claim 44, wherein the substrate comprises a second external surface arranged opposing the first external surface, and the plurality of ridges comprises a second surface cantilever engaging a portion of the second external surface.

46. The semiconductor package of claim 39, wherein each of the plurality of grooves comprises a roughened surface sandwiched between two neighboring ridges.

47. The semiconductor package of claim 46, wherein the roughened surface comprises a burr connected to one of the two neighboring ridges.

48. A semiconductor package, comprising:
a substrate comprising a plurality of metal layers;
a thermal pad having a heat conductive body extending through the substrate;
a semiconductor die disposed on the thermal pad and in thermal communication with the thermal pad thereby enabling the thermal pad to dissipate heat away from the semiconductor die; and
an interlock structure comprising a plurality of ridges, and a plurality of grooves arranged in a corrugated manner that facilitate a mechanical interlock between the thermal pad and the substrate, the interlock structure serving as an interface between the substrate and thermal pad so as to provide the mechanical interlock between the thermal pad and the substrate, each of the plurality of ridges comprises a cantilever projecting outwardly from the thermal pad, wherein the cantilever is arranged corresponding to one layer of the plurality of the metal layers of the substrate.

49. The semiconductor package of claim 48, wherein the interlock structure is substantially smaller than the heat conductive body of the thermal pad in size.

50. The semiconductor package of claim 49, wherein the thermal pad comprises an etch-able material, and the thermal pad comprises an etch stop layer formed within the thermal pad that comprises a non-etch-able material.

51. The semiconductor package of claim 50, wherein:
the substrate comprises a plurality of metal layers electrically coupled to the semiconductor die; and
a plurality of vias interconnecting two of the plurality of metal layers,
wherein the thermal pad is substantially larger than each of the plurality of vias in size.

52. The semiconductor package of claim 51, wherein:
the thermal pad has a heat dissipating area taken along a cross-sectional plane substantially parallel to the substrate; and
the interlock structure has an interlock area taken along the cross-sectional plane, wherein the interlock area is substantially smaller than the heat dissipating area.

53. The semiconductor package of claim 48, wherein the thermal pad comprises the interlock structure and a heat dissipating portion, wherein the heat dissipating portion is at least 10 times larger than the interlock structure.

54. The semiconductor package of claim 53, wherein each of the plurality of ridges and the plurality of grooves are substantially parallel to each other.

55. The semiconductor package of claim 50, wherein the cantilever extends and is connected to the one layer of the plurality of the metal layers.

56. The semiconductor package of claim 50, wherein the substrate comprises a first external surface, and the plurality of ridges comprises a first surface cantilever engaging a portion of the first external surface.

57. The semiconductor package of claim 56, wherein the substrate comprises a second external surface arranged opposing the first external surface, and the plurality of ridges comprises a second surface cantilever engaging a portion of the second external surface.

58. The semiconductor package of claim 50, wherein each of the plurality of grooves comprises a roughened surface sandwiched between two neighboring ridges.

59. The semiconductor package of claim 58, wherein the roughened surface comprises a burr connected to one of the two neighboring ridges.

* * * * *